United States Patent [19]
Pedersen

[11] Patent Number: 5,909,236
[45] Date of Patent: Jun. 1, 1999

[54] LASER EXPOSURE APPARATUS

[75] Inventor: Flemming Steen Pedersen, Køge, Denmark

[73] Assignee: Krause Danmark A/S, Denmark

[21] Appl. No.: 08/952,317

[22] PCT Filed: May 1, 1996

[86] PCT No.: PCT/DK96/00200

§ 371 Date: Oct. 31, 1997

§ 102(e) Date: Oct. 31, 1997

[87] PCT Pub. No.: WO96/34747

PCT Pub. Date: Nov. 7, 1996

[30] Foreign Application Priority Data

May 2, 1995 [DK] Denmark .......................... 9500172 U

[51] Int. Cl.$^6$ ...................................................... G03F 7/24
[52] U.S. Cl. ........................ 347/257; 347/242; 359/210
[58] Field of Search .................................. 347/241, 242, 347/245, 256, 257; 359/210; 369/249; 384/12

[56] References Cited

U.S. PATENT DOCUMENTS

| | | | |
|---|---|---|---|
| 3,632,207 | 1/1972 | Wachter | 355/85 |
| 4,099,800 | 7/1978 | Bell et al. | 384/12 |
| 4,455,641 | 6/1984 | Sliski | 369/249 |
| 5,592,324 | 1/1997 | Inagaki et al. | 359/210 |

FOREIGN PATENT DOCUMENTS

WO 92/04661  3/1992  WIPO.

*Primary Examiner*—N. Le
*Assistant Examiner*—Hai C. Pham
*Attorney, Agent, or Firm*—Scully, Scott, Murphy & Presser

[57] ABSTRACT

A laser exposure apparatus for exposing exposure material (6), such as light-sensitive offset printing plates. The apparatus comprises a relatively heavy base member and an optical scanning unit (2) employing a movable mirror for deflecting a laser beam. The base member (1) comprises a substantially semi-cylindrical exposure surface (5), on which the exposure material (6) can be placed. A bridge (7) is arranged above the base member (1), said bridge being displaceable along the base member in the longitudinal direction thereof by means of an advancing device (8), the mirror being placed on said bridge. The advancing device (8) is arranged along one side of the base member, and the bridge is mounted in a completely or almost completely balanced manner relative to the advancing device (8) by means of a counterweight (9) provided on a projecting portion (7') of the bridge (7), the center of gravity (G) of said counterweight being placed on the other side of the advancing device (8). The bridge (7) can optionally rest on longitudinal supporting surfaces (10', 10'', 10''') on the base member (1). As a result, an increased accuracy is obtained in connection with the exposure of the exposure material.

9 Claims, 2 Drawing Sheets

LASER EXPOSURE APPARATUS

TECHNICAL FIELD

The invention relates to a laser exposure apparatus for exposing exposure material in form of light-sensitive offset printing plates, said apparatus comprising a relatively heavy base member of for instance granite and an optical scanning unit employing a movable mirror deflecting a laser beam, and where the base member comprises a semi-cylindrical or planar exposure surface, on which the exposure material can be placed, and where a bridge is arranged above said base member, said bridge being displaceable along said base member in one direction thereof by means of an advancing device, and where the mirror is mounted on said bridge.

BACKGROUND ART

A laser exposure apparatus is known which comprises a semi-cylindrical base member, and where a bridge in form of a carriage extends transverse to the base member, said carriage at one side being supported and advanced by an advancing device and at the opposite side resting on a guide. Such a mounting of the bridge is not quite satisfying due to a lack of accuracy. In order to obtain an improved accuracy it is also known to place a screw drive in the longitudinal centre plane of the base member and parallel to said base member, but such an arrangement is not preferred because it is thereby difficult to obtain the necessary room for mounting the exposure material on the base member.

BRIEF DESCRIPTION OF THE INVENTION

The object of the invention is to provide a laser exposure apparatus of the above type, which allows an improved accuracy during the exposure of the exposure material, and which furthermore allows an easy access for the mounting of said material on the base member.

The laser exposure apparatus according to the invention is characterised in that the advancing device is placed along one side of the base member, and that the bridge is mounted in a substantially balanced manner relative to the advancing device by means of a counterweight provided on a projecting portion of the bridge, the centre of gravity of said counterweight being placed opposite the optical scanning unit relative to the advancing and in the vicinity of said device, and that the bridge rests on supporting surfaces on the base member. The resulting exposure is much more accurate than hitherto known, and as the advancing device is positioned at one side of the base member the access to the semi-cylindrical surface of the base member is easy when the exposure material is to be mounted thereon.

According to the invention the bridge may preferably rest on longitudinal supporting surfaces on the base member.

According to the invention, the bridge may rest on the longitudinal supporting surfaces of the base member by means of non-contact bearings, such as air-cushion bearings or magnetic bearings, whereby the stability and consequently the position accuracy of the bridge are increased.

According to the invention, at least one of the supporting surfaces may be inclined relative to the longitudinal centre plane of the base member, whereby the stability of the bridge is further increased.

Moreover according to the invention, the counterweight may be integrally formed with the bridge with the result that a particularly simple manufacture of the bridge is obtained.

According to the invention, non-contact bearings may be provided between the counterweight and the base member at an inclined supporting surface and/or a substantially vertical supporting surface, respectively, on said base member, while a third non-contact bearing may be provided at the end of the bridge farthest away from the counterweight, said third non-contact bearing co-operating with a substantially horizontal supporting surface on the base member. As a result, a further possibility is obtained of an accurate speed control/positioning of the bridge.

Moreover according to the invention, it is particularly advantageous to place the common centre of gravity of the bridge and of the equipment and the counterweight mounted thereon substantially vertically above or below or within the advancing device.

Finally, according to the invention the advancing device may be a screw drive, a stepping motor advancing device, a brushless DC motor advancing device or an accurate cable or chain drive with a speed control. As a result, a particularly reliable advancing is obtained of the bridge along the base member.

BRIEF DESCRIPTION OF THE DRAWING

The invention is explained in greater detail below with reference to the accompanying drawing, in which.

DESCRIPTION OF THE PREFERRED EMBODIMENTS

Figure 1:
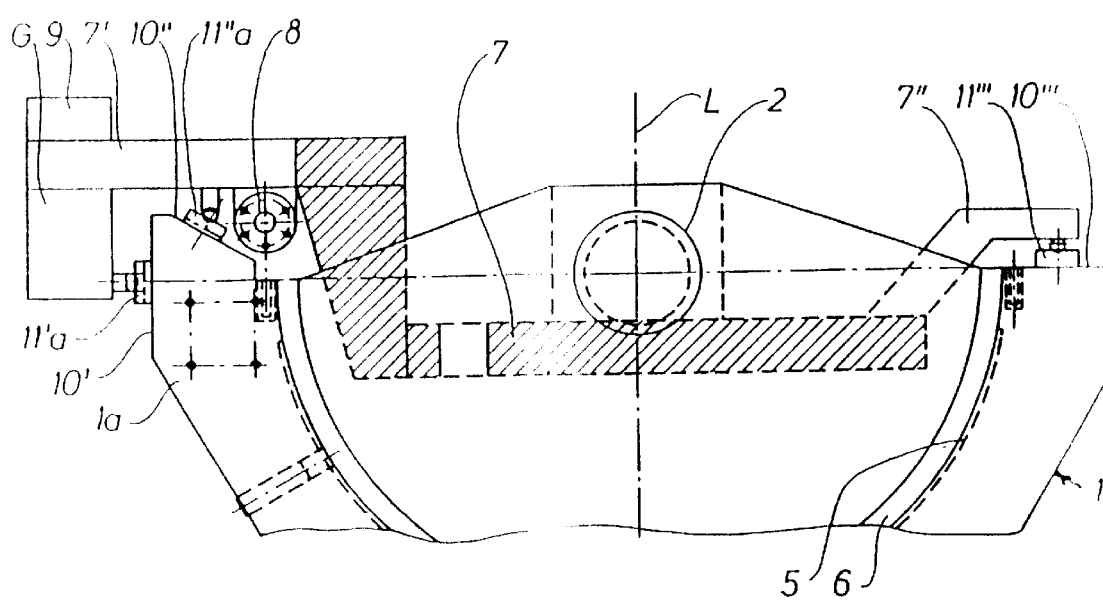
FIG. 1 is an end view of an embodiment of the laser exposure apparatus according to the invention, whereby, however, a portion of the bridge has been cut.

The laser exposure apparatus of FIG. 1 comprises a relatively heavy base member 1 of for instance granite or metal, and an optical scanning unit 2 employing a movable, preferably rotating mirror for deflecting a laser beam directed towards a semi-cylindrical exposure surface 5 on the base member. Exposure material, such as a light-sensitive offset printing plate, can be placed on the above exposure surface 5. A bridge 7 is arranged above the base member 1, said bridge carrying the scanning unit and the mirror. The bridge is displaceable along the base member 1 along a center axis of the exposure surface 5, as shown by line A—A in FIG. 3, by means of an advancing device 8. The advancing device is arranged along one side 1a of the base member 1 in the entire length thereof. The bridge is mounted in a completely or almost completely balanced manner relative to the advancing device 8, whereby a projecting counterweight 9 is provided on the portion 7' of the bridge 7 projecting beyond the advancing device 8. In other words, the counterweight has a centre of gravity G, cf. FIG. 1, placed opposite to the optical scanning unit 2 relative to the advancing device 8 and in the vicinity of said device. The bridge 7 can optionally rest on the base member at some longitudinal supporting surfaces 10', 10", 10''' on the latter.

The support of the bridge at the supporting surfaces 10', 10", 10''' can be provided by means of non-contact bearings 11', 11", 11'''. These bearings can for instance be air-cushion bearings or magnetic bearings.

One or more of the above supporting surfaces can be inclined relative to the longitudinal centre plane L of the base member 1, only one inclined supporting surface being shown in the embodiment shown in the Figures, viz. the supporting surface 10". As clearly shown in FIGS. 1 and 3, the longitudinal centre plane L is orthogonal to the center axis A—A of the exposure surface 5.

Nothing prevents the counterweight 9 from being integrally formed with the bridge 7.

Figure 2:
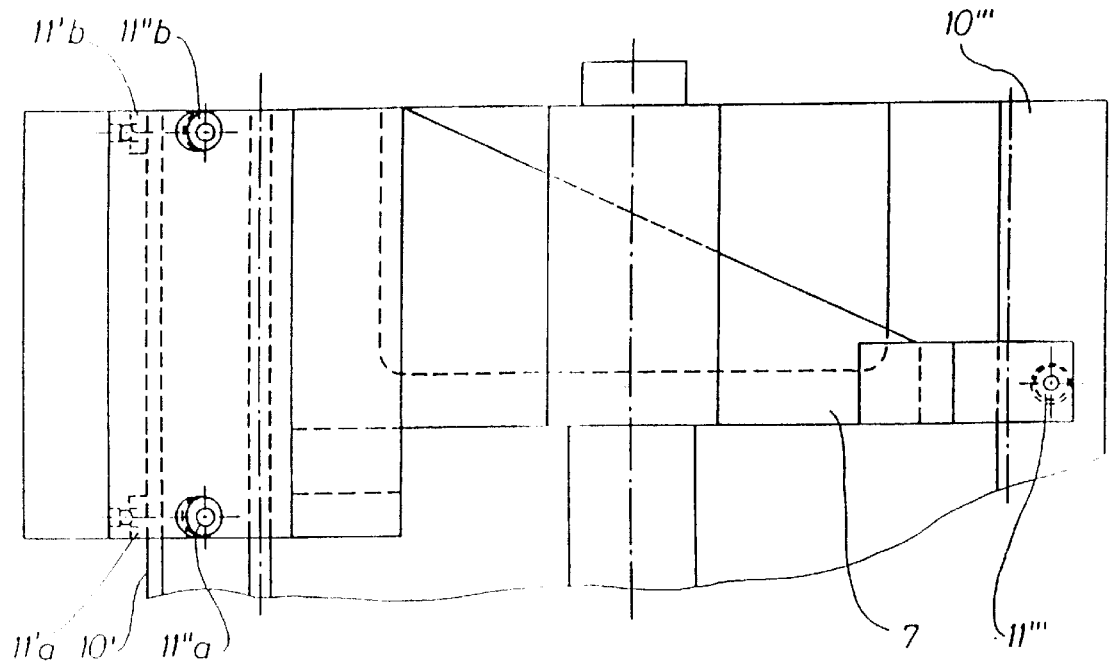
FIG. 2 is a top view of the bridge.

As shown in FIG. 2, two non-contact bearings 11"a and 11"b can be provided between the counterweight 9 and the base member 1 at the inclined supporting surface 10", and two non-contact bearings 11'a and 11'b can be provided at the substantially vertical supporting surface 10'. The supporting surface 10'" is substantially horizontal at the end 7" of the bridge 7 being farthest away from the counterweight.

The advancing device 8 can be a screw drive, a stepping motor device, a DC motor without brushes or an accurate cable or chain drive with a speed control. In the illustrated embodiment, the advance device is a screw drive.

Figure 3:
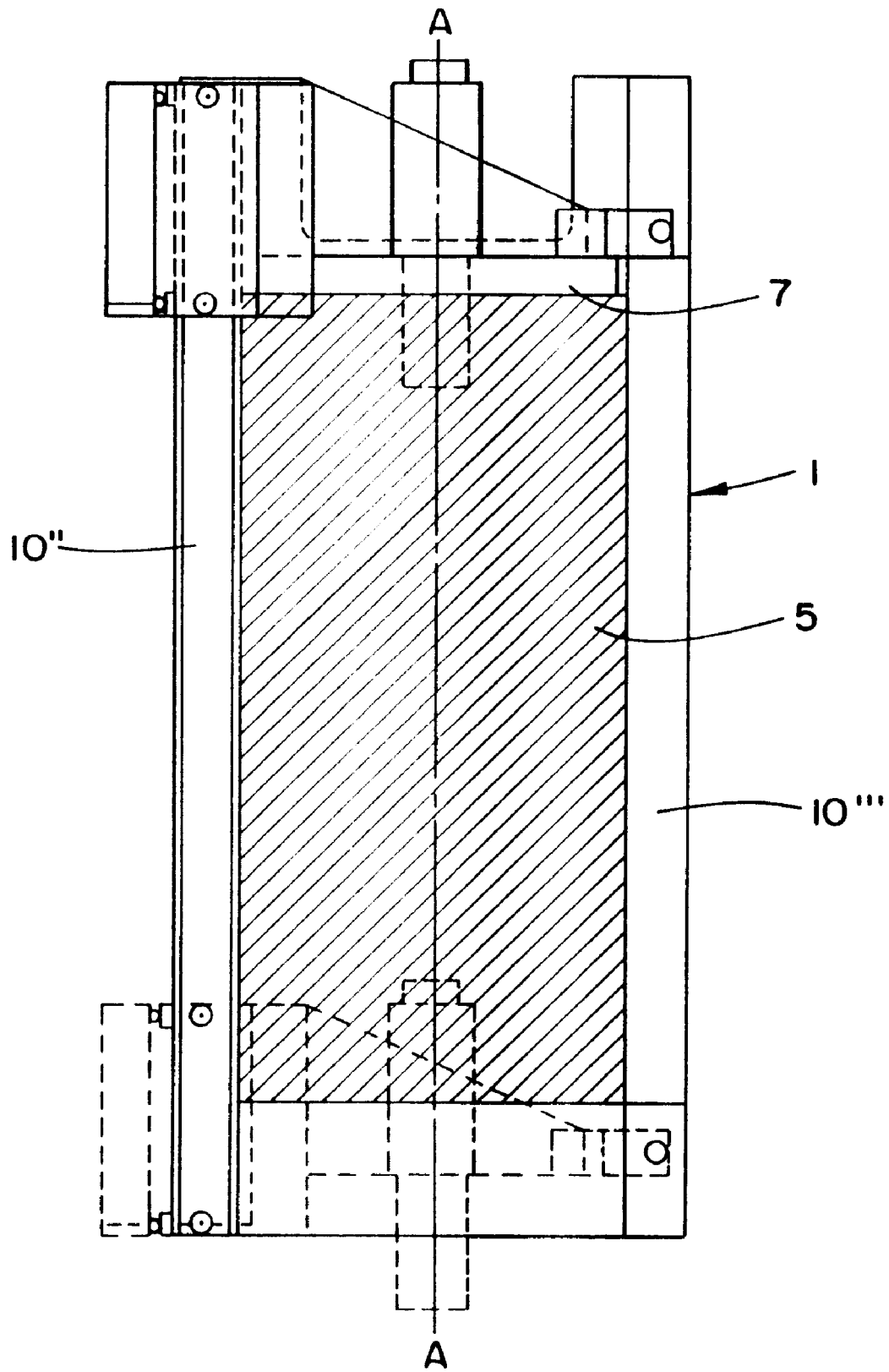
FIG. 3 illustrates on a rather small scale the laser exposure apparatus, where the exposure area of the base member is indicated in a hatched manner.

In FIG. 3 the bridge 7 is placed at one end of the base member. The bridge can be moved to the opposite end of the base member as illustrated. The bridge can also be made of steel or granite, and the counterweight can be made of steel.

As far as the device of the scanning unit 2 is concerned, it should be noted that it can be built of a rotatable polygonal mirror deflecting a laser beam from a laser fixed on the bridge. The laser beam is turned on and off in a conventional manner.

The common centre of gravity of the bridge 7, the exposure equipment and of the counterweight 9 mounted thereon is placed substantially vertically above or below or within the advancing device 8.

The invention can be modified in many ways without thereby deviating from the scope thereof.

Reference is above made to a "semi-cylindrical" exposure surface. This expression should be understood in the widest sense and such that it also covers a substantially plane exposure surface where the radius of the semi-cylinder is of an endless magnitude.

I claim:

1. A laser exposure apparatus for exposing exposure material, the apparatus comprising:

a base member having longitudinal support surfaces and a substantially semi-cylindrical exposure surface on which the exposure material is placed;

a bridge displaceable along a center axis of the exposure surface by means of an advancing device disposed at one side of the base member, the bridge further having a counterweight with a center of gravity at the side of the base member containing the advancing device for substantially balancing the bridge upon the longitudinal supporting surfaces; and an optical scanning unit disposed on the bridge at the center axis of the exposure surface, the optical scanning unit employing a movable mirror for deflecting a laser beam onto the exposure material.

2. The laser exposure apparatus as claimed in claim 1, wherein the bridge rests on the longitudinal supporting surfaces by means of non-contact bearings.

3. The laser exposure apparatus as claimed in claim 2, wherein the non-contact bearings are air-cushion bearings.

4. The laser exposure apparatus as claimed in claim 2, wherein the non-contact bearings are magnetic bearings.

5. The laser exposure apparatus as claimed in claim 1, wherein at least one of the supporting surfaces is inclined relative to a plane orthogonal to the center axis of the exposure surface.

6. The laser exposure apparatus as claimed in claim 1, wherein the counterweight is integrally formed with the bridge.

7. The laser exposure apparatus as claimed in claim 1, further comprising first and second non-contact bearings disposed between the counterweight and the base member at an inclined supporting surface and substantially vertical supporting surface, respectively, on the base member, and a third non-contact bearing disposed on an end of the bridge farthest away from the counterweight, the third non-contact bearing co-operating with a substantially horizontal supporting surface on the base member.

8. The laser exposure apparatus as claimed in claim 1, wherein the center of gravity of the bridge, the optical scanning unit and the counterweight mounted thereon is positioned substantially vertically above or below or within the advancing device.

9. The laser exposure apparatus as claimed in claim 1, wherein the advancing device is selected from a group consisting of a screw drive, a stepping motor advancing device, a brushless DC motor advancing device, and an accurate cable or chain drive with a speed control.

* * * * *

UNITED STATES PATENT AND TRADEMARK OFFICE
CERTIFICATE OF CORRECTION

PATENT NO. : 5,909,236
DATED : June 1, 1999
INVENTOR(S) : Flemming S. Pedersen

It is certified that error appears in the above-identified patent and that said Letters Patent is hereby corrected as shown below:

Column 3, claim 1,
Line 44, "displaceable" should read -- displaceably positioned --

Signed and Sealed this

Sixth Day of November, 2001

*Attest:*

*Attesting Officer*

NICHOLAS P. GODICI
*Acting Director of the United States Patent and Trademark Office*